United States Patent
Chang et al.

(10) Patent No.: US 8,447,259 B2
(45) Date of Patent: May 21, 2013

(54) MODE-SWITCHING LOW-NOISE AMPLIFIER AND WIDE-BAND RF RECEIVER

(75) Inventors: Jae-Hong Chang, Seongnam-si (KR); Hyung-Ki Ahn, Seoul (KR); Hui-Jung Kim, Suwon-si (KR)

(73) Assignee: Samsung Electronics Co., Ltd.

( * ) Notice: Subject to any disclaimer, the term of this patent is extended or adjusted under 35 U.S.C. 154(b) by 1155 days.

(21) Appl. No.: 12/358,372

(22) Filed: Jan. 23, 2009

(65) Prior Publication Data
US 2009/0191838 A1    Jul. 30, 2009

(30) Foreign Application Priority Data
Jan. 24, 2008    (KR) .............................. 2008-0007306

(51) Int. Cl.
*H03D 11/02*    (2006.01)

(52) U.S. Cl.
USPC ..... 455/341; 455/144; 455/127.1; 455/343.1; 455/293; 455/318; 330/302; 330/127; 330/311; 331/59

(58) Field of Classification Search
USPC ................. 455/341, 144, 127.1, 343.1, 293, 455/318; 330/302, 127, 311; 331/59
See application file for complete search history.

(56) References Cited

U.S. PATENT DOCUMENTS

| | | | |
|---|---|---|---|
| 4,190,808 A * | 2/1980 | Fajen | 331/59 |
| 7,084,707 B2 * | 8/2006 | Razavi et al. | 330/302 |
| 7,187,239 B2 * | 3/2007 | Yeh | 330/295 |
| 8,064,869 B2 * | 11/2011 | Reis | 455/318 |

* cited by examiner

*Primary Examiner* — Junpeng Chen
(74) *Attorney, Agent, or Firm* — Volentine & Whitt, PLLC

(57) ABSTRACT

A mode-switching LNA generally includes an input unit, an output unit and a bias voltage generator. The input unit amplifies an input signal to generate an amplified signal. The output unit receives the amplified signal from the input unit and operates either in an oscillation mode or in an amplification mode in response to a control signal to generate an output signal having a center frequency equal to a target frequency. The control signal indicates whether the center frequency of the output signal is the same as the target frequency. The bias voltage generator provides an input bias voltage to the input unit in response to the control signal, where the input bias voltage includes a first bias voltage in the amplification mode and a second bias voltage in the oscillation mode.

19 Claims, 8 Drawing Sheets

MODE-SWITCHING LOW-NOISE AMPLIFIER AND WIDE-BAND RF RECEIVER

PRIORITY STATEMENT

This application claims priority under 35 USC §119 to Korean Patent Application No. 2008-0007306 filed on Jan. 24, 2008, the subject matter of which is hereby incorporated by reference.

BACKGROUND

The invention relates to radio frequency (RF) devices, and more particularly to low-noise amplifiers (LNA) and radio frequency (RF) receivers having LNAs.

In general, a wide-band RF receiver utilizes a high performance LNA as a front end amplifier. LNAs are characterized by a high signal-to-noise ratio (SNR), excellent linearity across a wide frequency range, and adaptability to a wide range of input signal levels.

To achieve these characteristics, conventional LNAs often include an inductive/capacitive (LC) load. LNAs including a LC load typically exhibit good filtering performance. However, such LNAs also exhibit relatively poor frequency response because the LC load is sensitive to variations in its constituent manufacturing processes. In particular, if a LC load having a higher Q-value is used, LNAs exhibit superior filtering performance but are very sensitive to manufacturing process variations. For this reason, conventional LNAs typically include a LC load having a relatively low Q-value or an expensive LC load carefully calibrated throughout manufacturing. Thus, the choice between conventional LNAs is often a choice between good filtering performance when relatively low Q-value LC load is used, or good frequency response when a relatively high Q-value LC load is used.

SUMMARY

Embodiments of the invention provide a mode-switching LNA including a load having a relatively high Q-value, but also exhibiting reduced sensitivity to manufacturing process variations. Other embodiments provide a wide-band RF receiver including this type of mode-switching LNA.

In one embodiment, the invention provides a mode-switching low-noise amplifier (LNA) comprising; an input unit configured to amplify an input signal and generate an amplified signal, and an output unit configured to receive the amplified signal and adaptively operate in either an oscillation mode or an amplification mode in response to a control signal to thereby generate an output signal having a center frequency equal to a target frequency, wherein the control signal is defined in relation to the target frequency and the center frequency.

In another embodiment, the invention provides a wide-band RF receiver comprising; a mode-switching low-noise amplifier (LNA) configured to amplify an input signal to generate an output signal having a center frequency tuned to a target frequency in response to a control signal, a mixer configured to convert the output signal to a baseband signal, a baseband signal processor configured to process the baseband signal into a digital data output signal, a local oscillator configured to provide a local oscillation signal having the target frequency to the mixer, and a control unit configured to compare the center frequency with the target frequency and provide the control signal to the mode-switching LNA, wherein the control signal indicates whether the center frequency of the output signal is the same as the target frequency.

DESCRIPTION OF EMBODIMENTS

Figure 1:
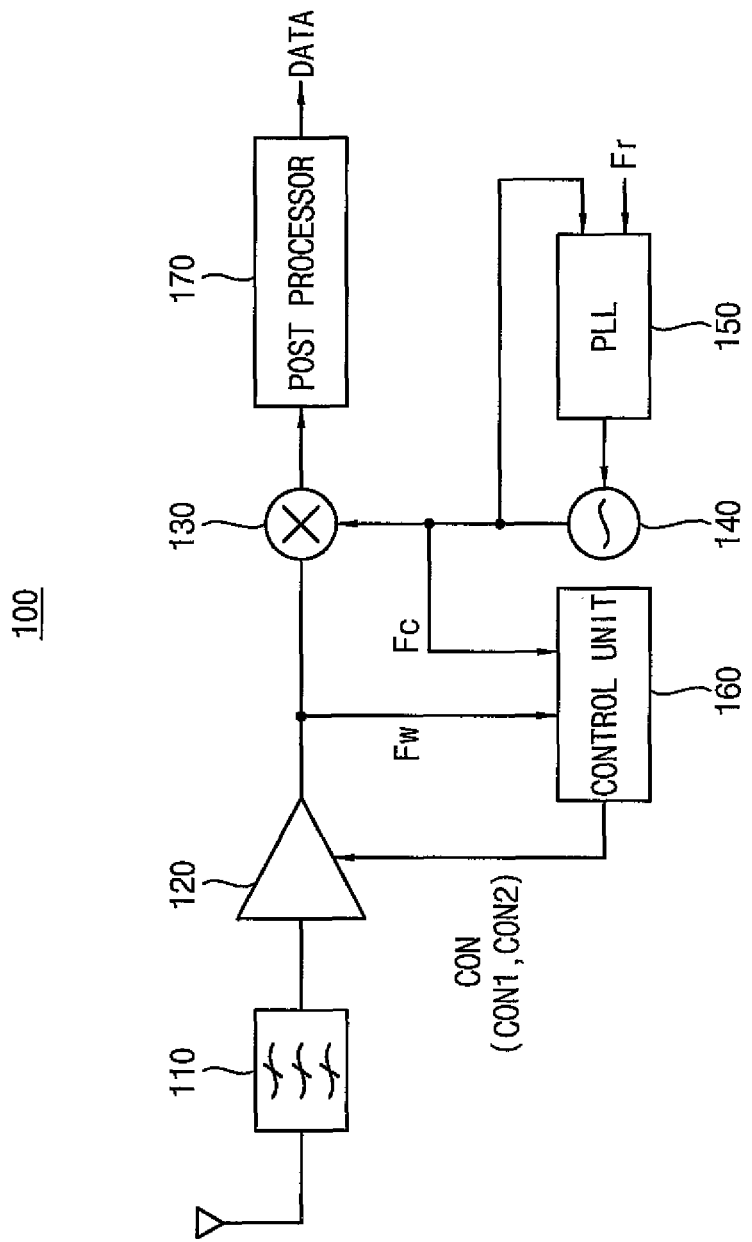
FIG. 1 is a block diagram illustrating a mode-switching LNA and a wide-band RF receiver having the mode-switching LNA according to an embodiment of the invention.

Embodiments of the invention will now be described in some additional detail with reference to the accompanying drawings. The present invention may, however, be embodied in many different forms and should not be construed as being limited to only the illustrated embodiments. Rather, these embodiments are presented as teaching examples. Throughout the drawings and written description, like reference numerals refer to like or similar elements.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a wide-band RF receiver including a mode-switching LNA according to an embodiment of the invention.

Referring to FIG. 1, a wide-band RF receiver 100 includes a LNA 120, a mixer 130, a local oscillator 140, a phase-locked loop (PLL) 150, a control unit 160 and a baseband signal (or "post") processor 170.

An RF signal having a center frequency "Fw" received by an antenna passes through a filter 110 and the filtered signal is amplified by the LNA 120. The LNA 120 is a mode-switching LNA according to an embodiment of the invention, and is capable of operating in either an amplification mode or an oscillation mode in response to one or more control signal(s) CON provided by the control unit 160. For example, the control signal CON may include a first control signal CON1 and a second control signal CON2. The operation and characteristics of the LNA 120 and the control unit 160 will be described later with reference to FIGS. 2A, 2B and 2C.

The output signal of the LNA 120 is converted to a baseband signal by the mixer 130 by mixing the output signal with a local oscillation signal having a predetermined target frequency Fc. The local oscillation signal having the target frequency Fc is generated by the local oscillator 140. The PLL 150 controls the local oscillator 140 to adjust the frequency of the local oscillation signal by comparing a reference signal Fr with a feedback signal based on the local oscillation signal to synchronize the phase and/or frequency of the local oscillation signal with the reference signal Fr.

The output signal of the mixer 130 is converted to a digital data and restored to an original data by the baseband signal processor 170. The baseband signal processor 170 may be of conventional design and may generally include a filter, an analog-digital converter and a digital signal processor (not shown).

Figure 2A:
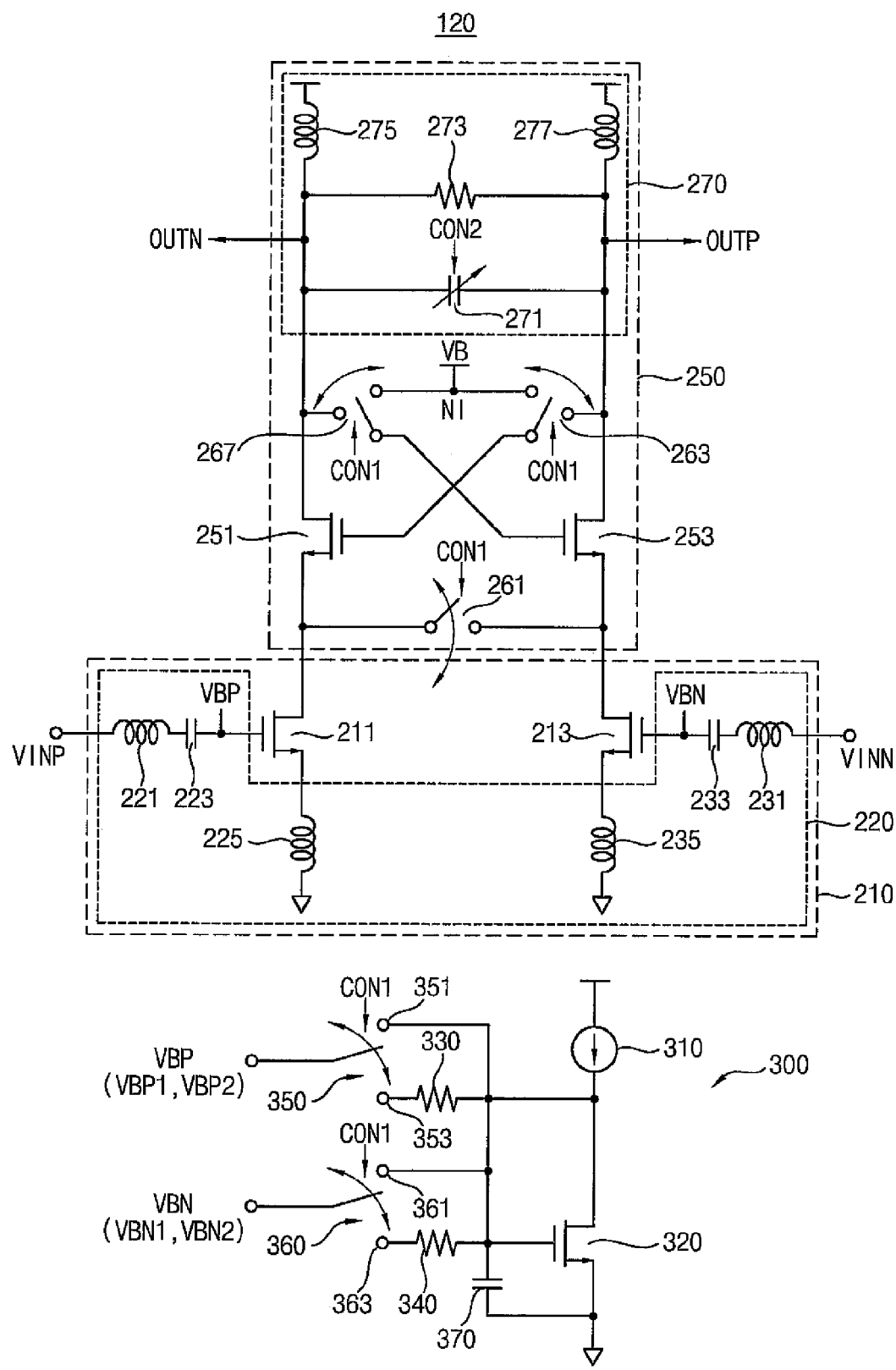
FIG. 2A is a circuit diagram illustrating a mode-switching LNA according to an embodiment of the invention.

FIG. 2A is a circuit diagram illustrating one possible embodiment for the mode-switching LNA included in the wide-band RF receiver 100 of FIG. 1. In this illustrated example, the mode-switching LNA assumes that the input signal is a differential signal, but this need not be the case.

Referring to FIG. 2A, a mode-switching LNA 120 includes an input unit 210 and an output unit 250. In the illustrated example, the LNA 120 further includes a bias voltage generator 300. The LNA 120 is used as a front end amplifier for the wide-band RF receiver 100.

The input unit 210 amplifies differential input signals VINP and VINN. The input unit 210 includes a first transistor 211, a second transistor 213 and an impedance matching unit 220. The first transistor 211 and the second transistor 213 may be implemented by a metal-oxide semiconductor field-effect transistor (MOSFET). Alternatively the first transistor 211 and the second transistor 213 may be implemented by other types of transistors, such as bipolar junction transistors.

More particularly in the illustrated example, the first transistor 211 and the second transistor 213 are N-type MOS (NMOS) transistors. However, P-type MOS (PMOS) transistors may alternately be used to implement the first transistor 211 and the second transistor 213. The impedance matching unit 220 includes a first inductor 221, a second inductor 225, a third inductor 231, a fourth inductor 235, a first capacitor 223 and a second capacitor 233.

The gate of the first transistor 211 receives a bias voltage VBP, the drain of the first transistor 211 is connected to the output unit 250 and the source of the first transistor 211 is connected to ground voltage through the second inductor 225. The first input signal VINP is applied to the gate of the first transistor 211 through the first inductor 221 and the first capacitor 223. The gate of the second transistor 213 receives a bias voltage VBN, the drain of the second transistor 213 is connected to the output unit 250 and the source of the second transistor 213 is connected to ground voltage through the fourth inductor 235. The second input signal VINN is applied to the gate of the second transistor 213 through the third inductor 231 and the second capacitor 233. The first capacitor 223 and the second capacitor 233 provide a DC blocking, and the first inductor 221, the second inductor 225, the third inductor 231 and the fourth inductor 235 provide an impedance matching. The first capacitor 223 and the second capacitor 233 may have substantially the same capacitance. The first inductor 221 and the third inductor 231 may have substantially the same inductance, and the second inductor 225 and the fourth inductor 235 may have substantially the same inductance. According to certain embodiments of the invention, the second inductor 225 and the fourth inductor 235 may be connected to a current source.

The output unit 250 is connected to the input unit 210 and operates either in the oscillation mode or in the amplification mode in response to the control signal CON to generate the output signals OUTP and OUTN having a center frequency Fw tuned to a target frequency Fc. The output unit 250 includes a third transistor 251, a fourth transistor 253, a load unit 270, a first switch 261, a second switch 263 and a third switch 267.

The source of the third transistor 251 is connected to the drain of the first transistor 211 and the drain of the third transistor 251 is connected to the load unit 270. The source of the forth transistor 253 is connected to the drain of the second transistor 213 and the drain of the fourth transistor 253 is connected to the load unit 270. The third transistor 251 and the fourth transistor 253 may be implemented using MOSFET devices. Alternatively the third transistor 251 and the fourth transistor 253 may be implemented using other types of transistors, such as bipolar junction transistors. In the illustrated example, the third transistor 251 and the fourth transistor 253 are NMOS transistors, but PMOS transistors may be used instead. The first switch 261 is connected between the source of the third transistor 251 and the source of the fourth transistor 253, and controlled by the first control signal CON1. The second switch 263 and the third switch 267 are connected to the gate of the third transistor 251 and the gate of the fourth transistor 253, respectively, and controlled by the first control signal CON1. The gate of the third transistor 251 receives an operative bias voltage VB or the output signal OUTP by the second switch 263 operating in response to the first control signal CON1. The gate of the fourth transistor 253 receives the operative bias voltage VB or the output signal OUTN by the third switch 267 operating in response to the first control signal CON1.

The load unit 270 includes a variable capacitor 271 coupled between the drain of the third transistor 251 and the drain of the fourth transistor 253, a first register 273, a fifth inductor 275 coupled between a power supply voltage VDD and a first end of the register 273 and a sixth inductor 277 coupled between the power supply voltage VDD and a second end of the register 273. The fifth inductor 275 and the sixth inductor 277 may have substantially the same inductance. The center frequency Fw of the output signals OUTP and OUTN is determined by the capacitance of the variable capacitor 271 and the inductances of the fifth inductor 275 and the sixth inductor 277 of the load unit 270.

The bias voltage generator 300 includes a current source 310, a fifth transistor 320, a second register 330, a third register 340, a fourth switch 350, a fifth switch 360 and a third capacitor 370. The bias voltage generator 300 generates (first) bias voltages VBP1 and VBN1 in the amplification mode or (second) bias voltages VBP2 and VBN2 in the oscillation mode in response to the first control signal CON1 applied to the fourth switch 350 and the fifth switch 360. The bias voltages VBP1 and VBN1 are provided through the second register 330 and the third register 340 that are RF blocking registers, and the bias voltages VBP2 and VBN2 are provided without using the second register 330 and the third register 340. For example, the fourth switch 350 and the fifth switch 360 are connected to nodes 353 and 363 respectively and generate the bias voltages VBP1 and VBN1 through the second register 330 and the third register 340 when the first control signal CON1 is in the logic high level, and the fourth switch 350 and the fifth switch 360 are connected to nodes 351 and 361 respectively and generate the bias voltages VBP2 and VBN2 without using the second register 330 and the third register 340 when the first control signal CON1 is in the logic low level.

The bias voltages VBP1 and VBN1 for the amplification mode block noise generated by the fifth transistor 320 using the second register 330, the third register 340 and the third capacitor 370, and the second register 330 and the third register 340 prevents the RF input signals VINP and VINN from leaking into the bias voltage generator 300.

The bias voltages VBP2 and VBN2 prevent the RF input signals VINP and VINN from being applied to the first transistor 211 and the second transistor 213 using the third capacitor 370 and the fifth transistor 320 so that the first transistor 211 and the second transistor 213 may be operated simply as a DC current mirror.

Figure 2B:
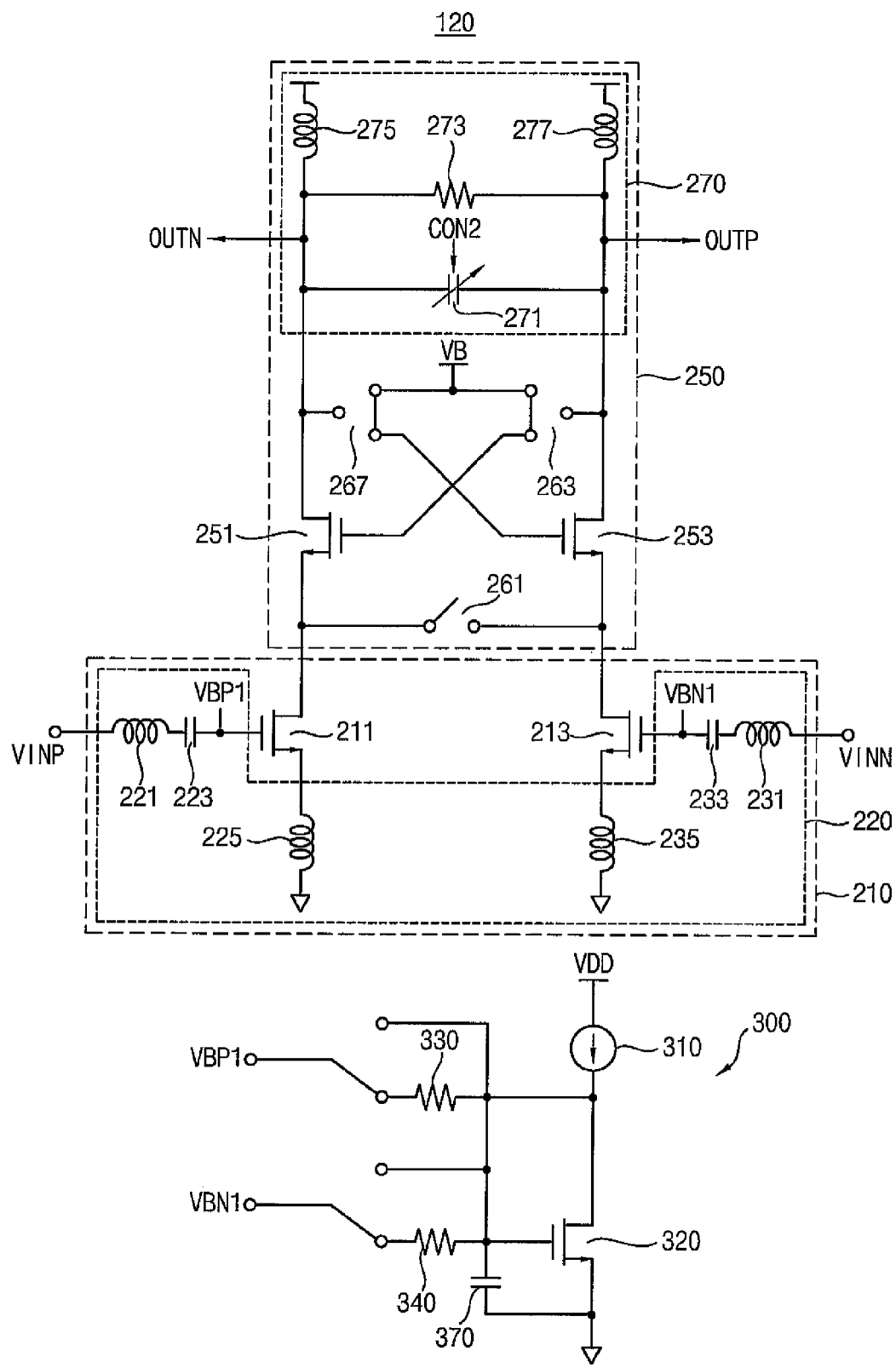
FIG. 2B is a circuit diagram further illustrating the operation of the mode-switching LNA of FIG. 2A in an amplification mode.

FIG. 2B is a circuit diagram further illustrating the operation of the mode-switching LNA of FIG. 2A in the amplification mode when the center frequency Fw of the output signal is the same as the target frequency Fc.

In the mode-switching LNA 120 of FIG. 2A, when the center frequency Fw of the output signals OUTP and OUTN are the same as the target frequency Fc, the first control signal CON1 may be, for example, logically "high", and the second control signal CON2 remains at a value set in the oscillation mode, where the first control signal CON1 and the second control signal CON2 are included in the control signal CON. When the first control signal CON1 is high, the bias voltages VBP and VBN are bias voltages VBP1 and VBN1, the first switch 261 is open, and the second switch 263 and the third switch 267 are connected to a node N1 to apply the operative bias voltage VB to the gate of the third transistor 251 and the gate of the forth transistor 253. The operative bias voltage VB may be the power supply voltage VDD or a sufficiently large voltage to cause the first through fourth transistors 211, 213, 251 and 253 to operate in saturation mode. That is, the operative bias voltage VB is larger than the bias voltages VBP and VBN. Therefore, when the center frequency Fw of the output signals OUTP and OUTN is the same as the target frequency Fc, the mode-switching LNA 120 operates in the amplification mode and amplifies the input signals VINP and VINN to generate the output signals OUTP and OUTN. And the center frequency Fw of the output signals OUTP and OUTN remains constant because the second control signal CON2 applied to the variable capacitor 271 of the load unit 270 is deactivated.

Figure 2C:
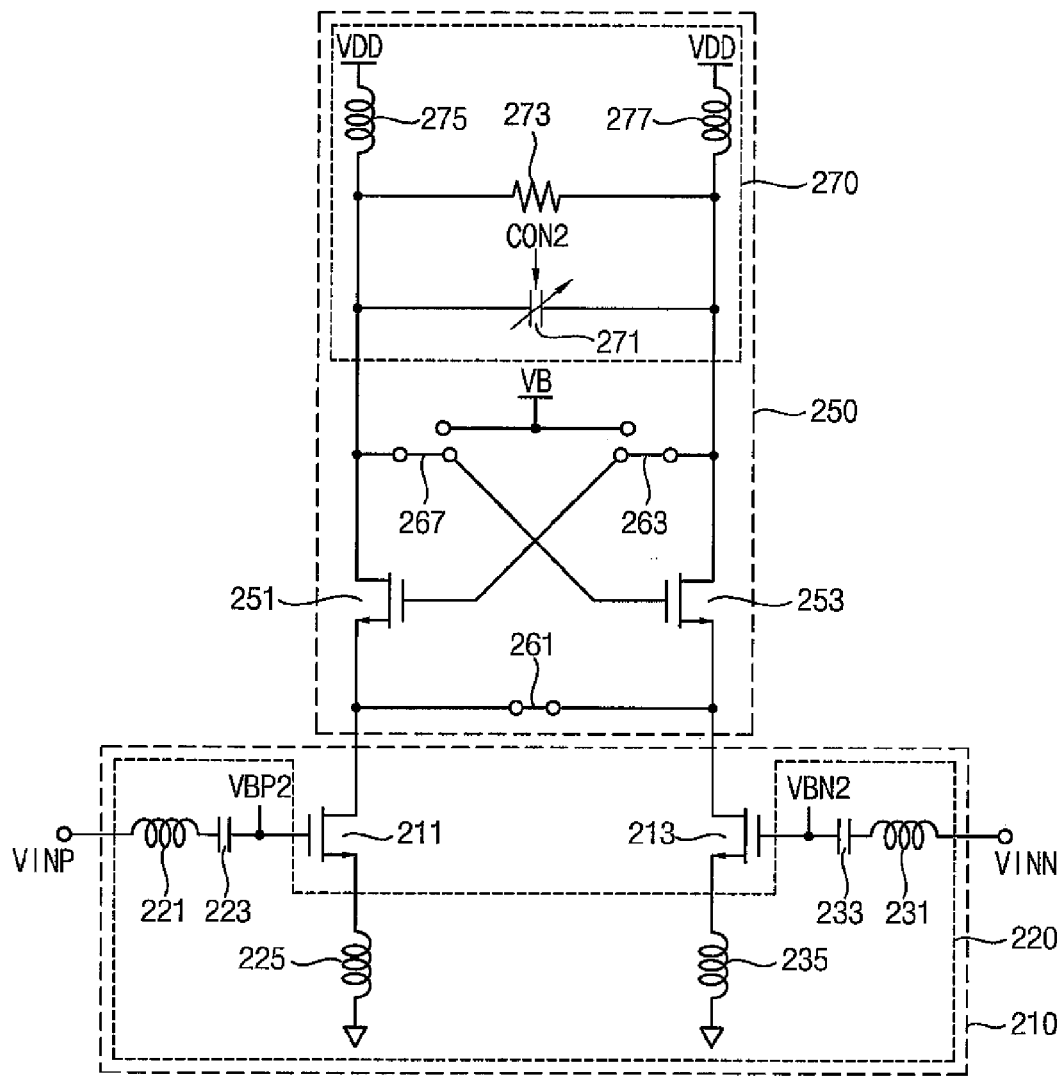
FIG. 2C is a circuit diagram further illustrating the operation of the mode-switching LNA of FIG. 2A in an oscillation mode.
Figure 2C:
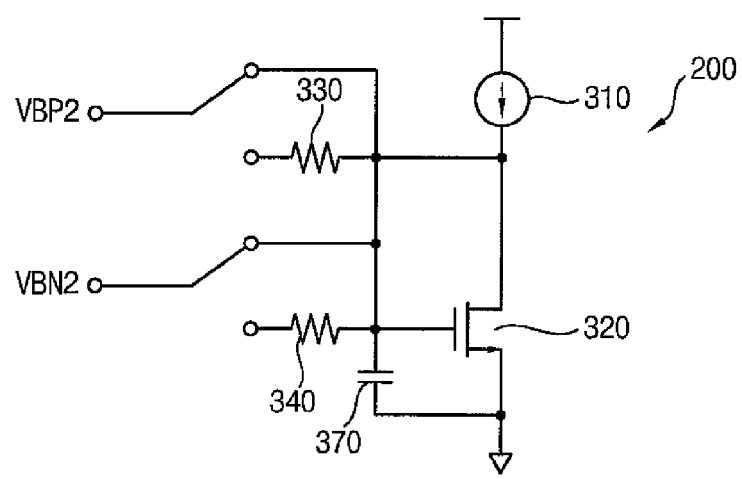

FIG. 2C is a circuit diagram further illustrating the operation of the mode-switching LNA of FIG. 2A in the oscillation mode when the center frequency Fw of the output signal is different from the target frequency Fc.

In the mode-switching LNA 120 of FIG. 2A, when the center frequency Fw of the output signals OUTP and OUTN are not tuned to the target frequency Fc, the first control signal CON1 may be, for example, logically "low", and the second control signal CON2 has a value in proportion to the difference between the center frequency Fw of the output signals OUTP and OUTN and the target frequency Fc. When the first control signal CON1 is low, the bias voltages VBP and VBN are bias voltages VBP2 and VBN2, the first switch 261 is closed, and the second switch 263 and the third switch 267 are connected to the drains of the third transistor 251 and the forth transistor 253. Therefore, when the center frequency Fw of the output signals OUTP and OUTN is not the same as the target frequency Fc, the mode-switching LNA 120 operates in the oscillation mode and changes the capacitance of the variable capacitor 271 of the load unit 270 in response to the second control signal CON2. The center frequency Fw of the output signals OUTP and OUTN changes in response to the change in the capacitance of the variable capacitor 271. If the center frequency Fw of the output signals OUTP and OUTN is tuned to the target frequency Fc, the first control signal CON1 goes high and the second control signal CON2 remains at a value set in the oscillation mode, and thus the mode-switching LNA 120 operates in the amplification mode. Therefore, even if the center frequency Fw of the output signals OUTP and OUTN is different from the target frequency Fc due to various reasons, such manufacturing process variations, the mode-switching LNA 120 may properly amplify the differential input signals VINP and VINN to generate the differential output signals OUTP and OUTN after tuning the center frequency Fw of the output signals OUTP and OUTN to the target frequency Fc during the oscillation mode.

It should be noted that the variable capacitor 271 included in the load unit 270 may be implemented in many different ways. For example, FIG. 3A is a circuit diagram illustrating one possible example of a load unit adapted for use in the mode-switching LNA of FIG. 2A where a variable capacitor is implemented with varactors.

Figure 3A:
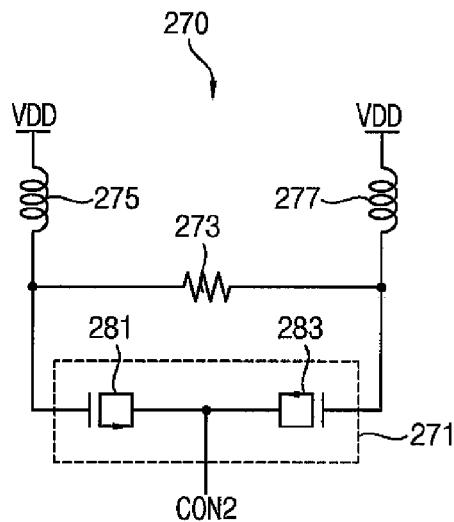
FIG. 3A is a circuit diagram illustrating one possible example of a load unit adapted or use in the mode-switching LNA of FIG. 2A.

Referring to FIG. 3A, the load unit 270 includes the variable capacitor 271 including a first varactor 281 and a second varactor 283. In this case, the second control signal CON2 applied to the variable capacitor 271 may be a voltage signal proportional to the difference between the target frequency Fc and the center frequency Fw of the output signals OUTP and OUTN. Therefore, the mode-switching LNA 120 may tune the center frequency Fw of the output signal OUTP and OUTN to the target frequency Fc by changing the capacitance of the variable capacitor 271 in response to the second control signal CON2 applied to the first varactor 281 and the second varactor 283.

Figure 3B:
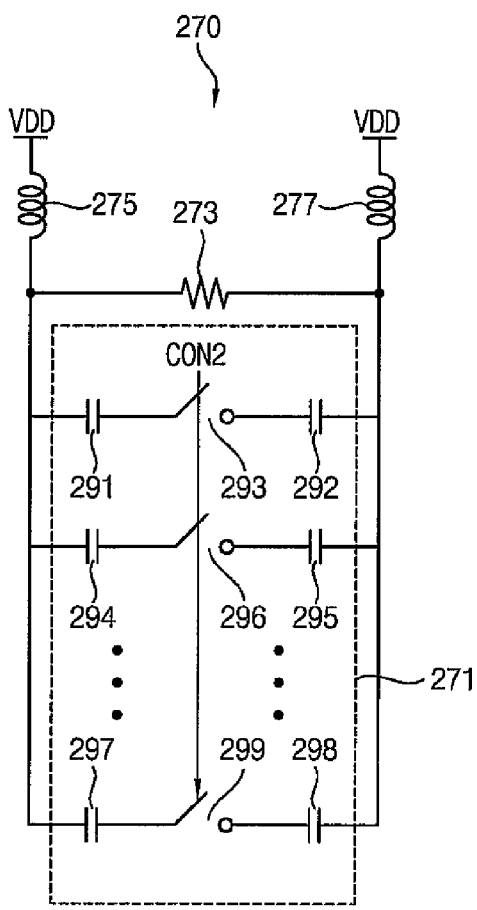
FIG. 3B is a circuit diagram illustrating another possible example of a load unit adapted for use in the mode-switching LNA of FIG. 2A.

FIG. 3B is a circuit diagram illustrating another possible example of a load unit adapted for use in the mode-switching LNA of FIG. A where a variable capacitor is implemented using a capacitor bank.

Referring to FIG. 3B, the load unit 270 includes a capacitor bank including first through sixth capacitors 291, 292, 294, 295, 297 and 298 and first, second and third switches 293, 296 and 299. In this example, the second control signal CON2 applied to the switches 293, 296 and 299 included in the capacitor bank may be a digital signal proportional to the difference between the center frequency Fw of the output signals OUTP and OUTN and the target frequency Fc. Therefore, the mode-switching LNA 120 may tune the center frequency Fw of the output signals OUTP and OUTN to the target frequency Fc by changing the capacitance of the variable capacitor 271 or by controlling the switches 293, 296 and 299 in response to the second control signal CON2.

Figure 4:
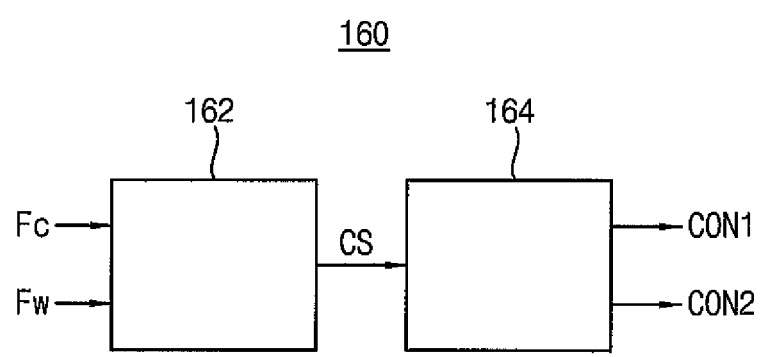
FIG. 4 is a general block diagram of a control unit included in the wide-band RF receiver of FIG. 1.

FIG. 4 is a general block diagram illustrating an example of a control unit included in the wide-band RF receiver of FIG. 1. Referring to FIG. 4, control unit 160 includes a frequency comparator 162 and a control signal generator 164.

Referring collectively to FIGS. 1 through 4, the frequency comparator 162 compares the center frequency Fw of the output signals OUTP and OUTN with the target frequency Fc of the local oscillation signal provided by the local oscillator 140 to generate a difference signal CS indicating the difference between the center frequency Fw of the output signals OUTP and OUTN and the target frequency Fc of the local oscillation signal.

The control signal generator 162 receives the difference signal CS from the frequency comparator 162 and generates the first control signal CON1 and the second control signal CON2. The logic level of the first control signal CON1 varies in accordance with whether the center frequency Fw of the output signals OUTP and OUTN is the same as the target frequency Fc. In the foregoing embodiments, the first control signal CON1 may be defined such that a logically high state indicates that the center frequency Fw of the output signals OUTP and OUTN is the same as the target frequency Fc, and a logically low state indicates that the center frequency Fw of the output signals OUTP and OUTN is not the same as the target frequency Fc. The first control signal CON1 may thus be used to determine operating mode by controlling the switches 261, 263, 267, 350 and 360 included in the mode-switching LNA 100.

In the foregoing embodiments, the second control signal CON2 is defined to have a value proportional to the magnitude of the difference signal CS received from the frequency comparator 162. Namely, the second control signal CON2 will have a value proportional to the difference between the center frequency Fw of the output signals OUTP and OUTN and the target frequency Fc. The second signal CON2 may be deactivated in a case where the center frequency Fw of the output signals OUTP and OUTN is the same as the target frequency Fc, and the second signal CON2 may be an analog voltage signal proportional to the difference between the center frequency Fw of the output signals OUTP and OUTN and the target frequency Fc or a digital signal when the center frequency Fw of the output signals OUTP and OUTN is not the same as the target frequency Fc. Therefore, even if the center frequency Fw of the output signals OUTP and OUTN is different from the target frequency Fc due to a variety of factors, the control unit 160 may tune the center frequency Fw of the output signals OUTP and OUTN to the target frequency Fc by applying the control signals CON1 and CON2 to the mode-switching LNA 100.

The control unit 160 of FIG. 4 may be embodied in various ways. In the case where the control unit 160 is embodied by an analog circuit, the control unit 160 may be a PLL without a voltage-controlled oscillator (VCO) (not shown). In this case, the frequency comparator 162 may be embodied by the phase frequency detector (PFD), and the control signal generator 164 may include a lock detector, charge pump and a loop filter. In this case, the first control signal CON1 may be an output signal of the lock detector, and the second control signal CON2 may be an output signal of the loop filter.

Figure 5:
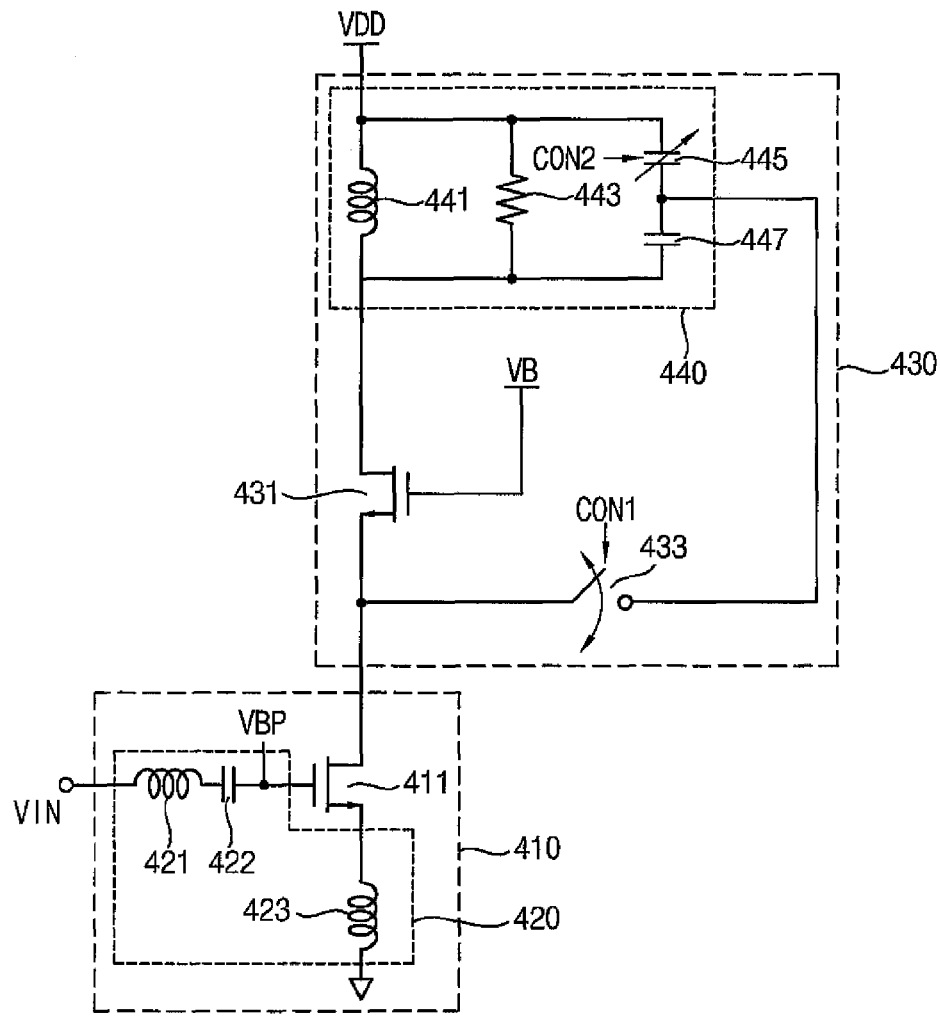
FIG. 5 is a circuit diagram illustrating a mode-switching LNA according to another embodiment of the invention.
Figure 5:
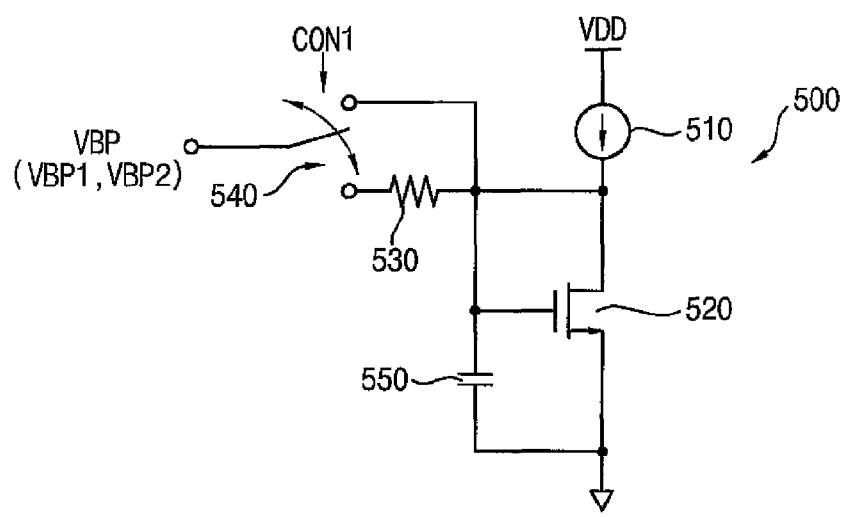

FIG. 5 is a circuit diagram illustrating a mode-switching LNA according to another embodiment of the invention. More particularly, FIG. 5 illustrates a mode-switching LNA receiving a single-ended input signal, rather than a differential input signal.

Referring to FIG. 5, a mode-switching LNA 400 includes an input unit 410, an output unit 430 and a bias voltage generator 500.

The input unit 410 includes a first transistor 411 and an impedance matching unit 420. The impedance matching unit 420 includes a first inductor 421, a second inductor 423 and a first capacitor 422. The gate of the first transistor 411 receives a bias voltage VBP, the drain of the first transistor 411 is connected to the output unit 430 and the source of the first transistor 411 is connected to the ground voltage through the second inductor 423. The input signal VIN is applied to the gate of the first transistor 411 through the first inductor 421 and the first capacitor 422. The first capacitor 422 provides a DC blocking. The first inductor 421 and the second inductor 423 provide an impedance matching.

The output unit 430 includes a second transistor 431, a first switch 433 and a load unit 440. The gate of the second transistor 431 receives an operative bias voltage VB. The load unit 440 includes a third inductor 441, a first register 443, a variable capacitor 445 and a second capacitor 447. The variable capacitor 445 and the second capacitor 447 are connected in series with each other and are connected in parallel with the third inductor 441 and the first register 443. The first switch 433 receives the first control signal CON1 and the variable capacitor 445 receives the second control signal CON2.

The bias voltage generator 500 includes a current source 510, a third transistor 520, a second register 530, a second switch 540 and a third capacitor 550. The second switch 540 receives the first control signal CON1.

The LNA 400 of FIG. 5 may be used as a front end amplifier of the wide-band RF receiver 100 of FIG. 1 when the input signal is a single-ended signal. The detailed description of the operation of the LNA 400 of FIG. 5 is omitted because the operation of the LNA 400 of FIG. 5 is similar to that of the LNA 100 of FIG. 2A.

Figure 6:
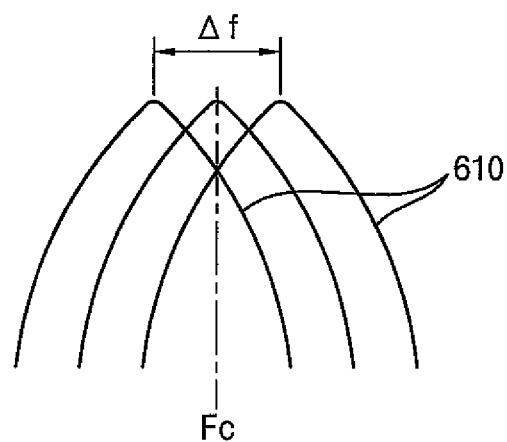
FIG. 6 is a diagram illustrating an exemplary frequency response for a mode-switching LNA and a wide-band RF receiver according to certain embodiments of the invention.

FIG. 6 is a diagram illustrating a model frequency response for the mode-switching LNA and a wide-band RF receiver of the foregoing embodiments.

As illustrated in FIG. 6, even if the center frequency Fw 610 of the output signals OUTP and OUTN vary from the target frequency Fc, the mode-switching LNA may tune the center frequency Fw of the output signals OUTP and OUTN to the target frequency Fc by operating in the oscillation mode.

The foregoing is illustrative of the present invention and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A mode-switching low-noise amplifier (LNA) comprising:
   an input unit configured to amplify an input signal and generate an amplified signal;
   an output unit configured to receive the amplified signal and adaptively operate in either an oscillation mode or an amplification mode in response to a control signal to thereby generate an output signal having a center frequency equal to a target frequency, wherein the control signal is defined in relation to the target frequency and the center frequency; and
   a bias voltage generator configured to provide an input bias voltage to the input unit in response to the control signal, wherein the input bias voltage is a first bias voltage during the amplification mode and a second bias voltage different from the first bias voltage during the oscillation mode.

2. A mode-switching low-noise amplifier (LNA) comprising:
   an input unit configured to amplify an input signal and generate an amplified signal; and
   an output unit configured to receive the amplified signal and adaptively operate in either an oscillation mode or an amplification mode in response to a control signal to thereby generate an output signal having a center frequency equal to a target frequency, wherein the control signal is defined in relation to the target frequency and the center frequency,
   wherein the input signal is a differential signal including a first input signal and a second input signal, and
   the input unit comprises:
   a first transistor having a drain connected to the output unit and a gate receiving the first input signal and an input bias voltage, wherein the input bias voltage is a first bias voltage in the amplification mode and a second bias voltage different from the first bias voltage in the oscillation mode;
   a second transistor having a drain connected to the output unit and a gate receiving the second input signal and the input bias voltage; and
   an impedance matching unit configured to provide impedance matching between the first input signal and the second input signal.

3. The mode-switching LNA of claim 2, wherein the output unit comprises:
   a third transistor having a source connected to the drain of the first transistor;
   a fourth transistor having a source connected to the drain of the second transistor;
   a load unit connected to a drain of the third transistor and a drain of the fourth transistor;
   a first switch configured to selectively connect the source of the third transistor to the source of the fourth transistor in response to the control signal; and
   a second switch and a third switch configured to respectively apply an operative bias voltage to a gate of the third transistor and gate of the fourth transistor, or cross-couple the third transistor with the fourth transistor in response to the control signal, wherein the operative bias voltage is greater than the input bias voltage.

4. The mode-switching LNA of claim 3, wherein the load unit comprises:
   a variable capacitor coupled between the drain of the third transistor and the drain of the fourth transistor;
   a resistor connected in parallel with the variable capacitor;
   a first inductor coupled between a power supply voltage and a first end of the register; and
   a second inductor coupled between the power supply voltage and a second end of the register.

5. The mode-switching LNA of claim 4, wherein the control signal comprises:
   a first control signal having a logic level defined in relation to whether the center frequency of the output signal is the same as the target frequency; and
   a second control signal having a level proportional to a difference between the center frequency of the output signal and the target frequency.

6. The mode-switching LNA of claim 5, wherein the mode-switching LNA operates in the amplification mode in response to the first control signal having a first logic level indicating that the center frequency of the output signal is the same as the target frequency, and the second control signal remaining at a value set in the oscillation mode, such that the first switch is open, the bias voltage for the amplification mode is applied to the gate of the first transistor and to the gate of the second transistor, and the operative bias voltage is applied to the gate of the third transistor and to the gate of the fourth transistor, and
   the mode-switching LNA operates in the oscillation mode in response to the first control signal having a second logic level indicating that the center frequency of the output signal is not the same as the target frequency, and the second control signal being applied to the variable capacitor such that the first switch is closed, the bias voltage for the oscillation mode is applied to the gate of the first transistor and to the gate of the second transistor, and the third transistor is cross-coupled with the fourth transistor.

7. The mode-switching LNA of claim 6, wherein the second control signal is an analog voltage signal and the variable capacitor is a varactor receiving the analog voltage signal.

8. The mode-switching LNA of claim 6, wherein the second control signal is a multi-bit digital signal and the variable capacitor is a capacitor bank receiving the multi-bit digital signal.

9. A mode-switching low-noise amplifier (LNA) comprising:
   an input unit configured to amplify an input signal and generate an amplified signal; and
   an output unit configured to receive the amplified signal and adaptively operate in either an oscillation mode or an amplification mode in response to a control signal to thereby generate an output signal having a center frequency equal to a target frequency, wherein the control signal is defined in relation to the target frequency and the center frequency,
   wherein the input signal is a single-ended signal, and
   the input unit comprises:
   a first transistor having a drain connected to the output unit and a gate receiving the input signal and an input bias voltage, the input bias voltage being a first bias voltage in the amplification mode and a second bias voltage different from the first bias voltage in the oscillation mode; and
   an impedance matching unit configured to provide impedance matching for the input signal.

10. The mode-switching LNA of claim 9, wherein the output unit comprises:
   a second transistor having a source connected to the drain of the first transistor and a gate receiving an operative bias voltage greater than the input bias voltage;

a load unit coupled between the second transistor and a power supply voltage; and a switch configured to selectively connect the source of the second transistor to the load unit in response to the control signal.

11. The mode-switching LNA of claim 10, wherein the load unit comprises:

an inductor coupled between the power supply voltage and a drain of the second transistor;

a register connected in parallel with the inductor; and a variable capacitor and a capacitor connected in series and further connected in parallel with the register, a node between the variable capacitor and the capacitor being connected to the source of the second transistor through the switch.

12. The mode-switching LNA of claim 11, wherein the control signal comprises a first control signal having a logic level defined in relation to whether the center frequency of the output signal is the same as the target frequency, and a second control signal having a value proportional to a difference between the center frequency of the output signal and the target frequency, and the mode-switching LNA operates in the amplification mode in response to the first control signal having a first logic level indicating that the center frequency of the output signal is the same as the target frequency, and the second control signal remaining at a value set in the oscillation mode, such that a switch is open and the bias voltage for the amplification mode is applied to the gate of the first transistor, and the mode-switching LNA operates in the oscillation mode in response to the first control signal having a second logic level indicating that the center frequency of the output signal is not the same as the target frequency, and the second control signal being applied to the variable capacitor such that the switch is closed and the bias voltage for the oscillation mode is applied to the gate of the first transistor.

13. A wide-band RF receiver comprising:

a mode-switching low-noise amplifier (LNA) configured to amplify an input signal to generate an output signal having a center frequency tuned to a target frequency in response to a control signal;

a mixer configured to convert the output signal to a baseband signal;

a baseband signal processor configured to process the baseband signal into a digital data output signal;

a local oscillator configured to provide a local oscillation signal having the target frequency to the mixer; and a control unit configured to compare the center frequency with the target frequency and provide the control signal to the mode-switching LNA, wherein the control signal indicates whether the center frequency of the output signal is the same as the target frequency.

14. The wide-band RF receiver of claim 13, wherein the control unit comprises:

a frequency comparator configured to compare the center frequency and the target frequency to generate a comparison signal indicating a difference between the center frequency and the target frequency; and a control signal generator configured to receive the comparison signal and generate a first control signal having a first logic level when the center frequency of the output signal is the same as the target frequency and a second logic level when the center frequency of the output signal is the not same as the target frequency, and a second control signal having a value proportional to a magnitude of the difference signal.

15. The wide-band RF receiver of claim 14, wherein the mode-switching LNA comprises:

an input unit configured to amplify the input signal to generate an amplified signal; and an output unit connected to the input unit and configured to operate in either an oscillation mode or an amplification mode in response to the control signal to generate the output signal having the center frequency equal to the target frequency; and a bias voltage generator configured to provide an input bias voltage to the input unit in response to the first control signal, the input bias voltage including a first bias voltage for the amplification mode and a second bias voltage for the oscillation mode.

16. The wide-band RF receiver of claim 15, wherein the input signal is a differential signal including a first input signal and a second input signal, and the input unit comprises:

a first transistor having a drain connected to the output unit and a gate receiving the first input signal and the input bias voltage;

a second transistor having a drain connected to the output unit and a gate receiving the second input signal and the input bias voltage; and an impedance matching unit configured to provide impedance matching between the first input signal and the second input signal.

17. The wide-band RF receiver of claim 16, wherein the output unit comprises:

a third transistor having a source connected to the drain of the first transistor;

a fourth transistor having a source connected to the drain of the second transistor;

a load unit connected to a drain of the third transistor and a drain of the fourth transistor;

a first switch configured to selectively connect the source of the third transistor to the source of the fourth transistor in response to the first control signal; and a second switch and a third switch configured to respectively apply an operative bias voltage to a gate of the third transistor and a gate of the fourth transistor, or cross-couple the third transistor with the fourth transistor in response to the first control signal, wherein the operative bias voltage is greater than the input bias voltage.

18. The wide-band RF receiver of claim 17, wherein the load unit comprises:

a variable capacitor coupled between the drain of the third transistor and the drain of the fourth transistor;

a resistor connected in parallel with the variable capacitor;

a first inductor coupled between a power supply voltage and a first end of the register; and a second inductor coupled between the power supply voltage and a second end of the register.

19. The wide-band RF receiver of claim 18, wherein the wide-band RF receiver operates in the amplification mode in response to the first control signal having a first logic level indicating that the center frequency of the output signal is the same as the target frequency, and the second control signal remaining at a value set in the oscillation mode, such that the switch is open, the bias voltage for the amplification mode is applied to the gate of the first transistor and the gate of the second transistor, and the operative bias voltage is applied to the gate of the third transistor and to the gate of the fourth transistor, and the wide-band RF receiver operates in the oscillation mode in response to the first control signal having a second logic level indicating that the center frequency of the output signal is not the same as the target frequency, and the second control signal being applied to the variable capacitor such that the first switch is closed, the bias voltage for the oscillation mode is applied to the gate of the first transistor and the gate of the second transistor, and the third transistor is cross-coupled with the fourth transistor.

* * * * *